United States Patent
Blanchard et al.

(10) Patent No.: US 7,061,072 B2
(45) Date of Patent: Jun. 13, 2006

(54) INTEGRATED CIRCUIT INDUCTORS USING DRIVEN SHIELDS

(75) Inventors: Richard A. Blanchard, Los Altos, CA (US); Michael J. Callahan, Austin, TX (US)

(73) Assignee: JBCR Innovations, LLP, Dallas, TX (US)

( * ) Notice: Subject to any disclaimer, the term of this patent is extended or adjusted under 35 U.S.C. 154(b) by 64 days.

(21) Appl. No.: 10/678,797

(22) Filed: Oct. 3, 2003

(65) Prior Publication Data

US 2004/0124960 A1 Jul. 1, 2004

Related U.S. Application Data

(60) Provisional application No. 60/436,487, filed on Dec. 26, 2002.

(51) Int. Cl.
*H01L 29/00* (2006.01)
(52) U.S. Cl. .................................. 257/531; 257/659
(58) Field of Classification Search ................ None
See application file for complete search history.

(56) References Cited

U.S. PATENT DOCUMENTS

| | | | |
|---|---|---|---|
| 6,160,303 A * | 12/2000 | Fattaruso | 257/531 |
| 6,233,012 B1 | 5/2001 | Guerrieri et al. | |
| 6,462,396 B1 | 10/2002 | Lemaire | |
| 6,784,518 B1 * | 8/2004 | Merckel et al. | 257/531 |
| 6,833,603 B1 * | 12/2004 | Park et al. | 257/528 |
| 2004/0124960 A1 * | 7/2004 | Blanchard et al. | 336/200 |

OTHER PUBLICATIONS

Wu, Yi-Cheng et al., On-Chip RF Sprial Inductors and Bandpass Filters Using Active Magnetic Energy Recovery, Proceedings of the IEEE 2002 Custom Integrated Circuits Conference, Jun. 2002.

Yue et al., On-Chip Spiral Inductors with Patterned Ground Sields for Si-Based RF IC's, IEEE Journal of Solid-State Circuits, vol. 33, No. 5, May 1998, p. 743-751.

Lihui et al., High Q Multilayer Spiral Inductor on Silicon Chip for 5-6 GHz, IEEE Electronic Device Letters, vol. 23, No. 8, Aug. 2002.

Chang et al., Large Suspended Inductors on Silicon and Their Use in a 2-um CMOS RF Amplifier, IEEE Electronic Device Letters, vol. 14, No. 5, May 1993.

(Continued)

*Primary Examiner*—Mark V. Prenty

(57) ABSTRACT

An integrated circuit is disclosed that includes a semiconductor substrate having a major body portion with a conductive layer having a predefined boundary and located on a first surface of the major body portion. An insulating layer is located over the conductive layer, over which an integrated inductor is located. An amplifier is connected between the integrated inductor and the conductive layer.

28 Claims, 7 Drawing Sheets

OTHER PUBLICATIONS

Yue et al., A Physical Model for Planar Spiral Inductors on Silicon, International Electron Devices Meeting 1996, Dec. 1996.

Tsukahara, et al., A 2GHz 60dB Dynamic-Range Si Logarithmic/Limiting Amplifier with Low-Phase Deviations, NTT System Electronics Laboratories, Int. Solid-State Circuits Conf. Dig. Tech. Papers, Feb. 1997, pp. 82-83.

Ashby, et al., High Q Inductors for Wireless Applications in a Complementary Silicon Bipolar Process, IEEE J. Solid-State Circuits, vol. 31, Jan. 1996, pp. 4-9.

Rofougaran, et al., A 1 GHz CMOS RF Front-End IC for a Direct-Conversion Wireless Receiver, IEEE J. Solid-State Circuits, vol. 31, Jul. 1996, pp. 880-889.

* cited by examiner

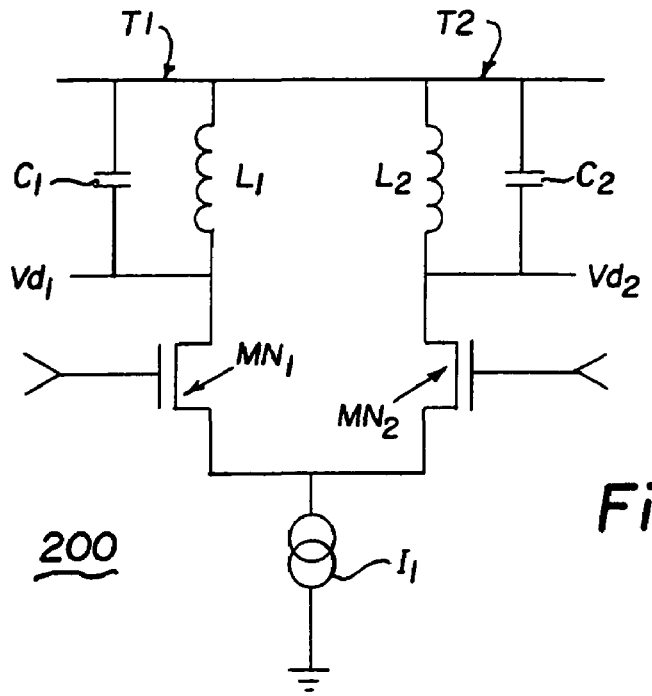
Fig. 2
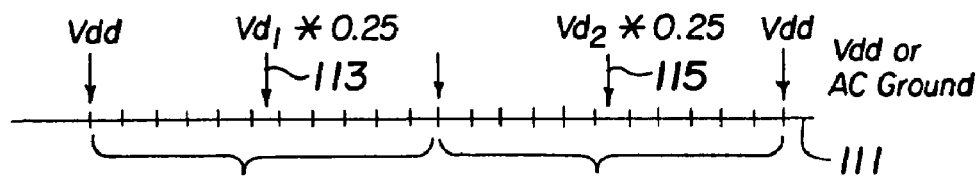
Fig. 6a
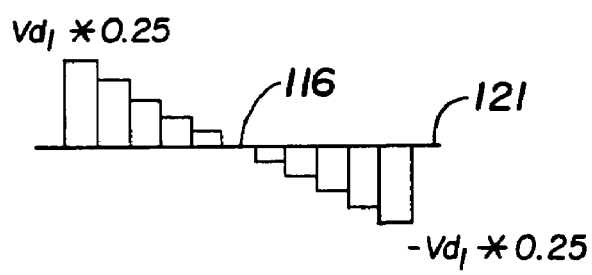
Fig. 6b 11 Segments @ 150%
Weighted average of 86%

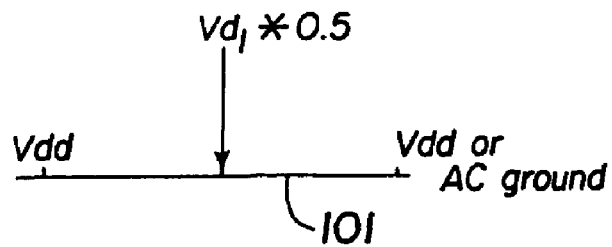
Fig. 3a
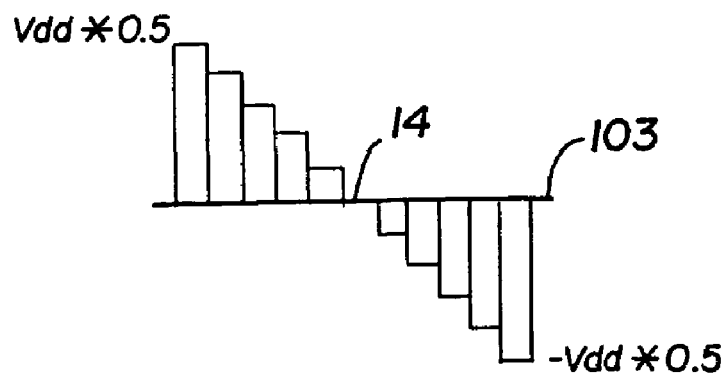
Fig. 3b
```
2 X 50 % = 100
2 X 40 % =  80
2 X 30 % =  60
2 X 20 % =  40
2 X 10 % =  20
1 X  0 % =   0
```
11 Segments    300
Weighted average of 27%
% Capacitance cancellation has a weighted average of 73%
Fig. 3c

INTEGRATED CIRCUIT INDUCTORS USING DRIVEN SHIELDS

CROSS REFERENCE TO RELATED APPLICATIONS

This application claims the benefit of U.S. Provisional Application No. 60/436,487, filed Dec. 26, 2002.

BACKGROUND OF THE INVENTION

This invention relates to integrated inductors on Integrated Circuits (ICs) and in particular to ICs manufactured with modern fine-line CMOS processes that are capable of operating at a frequency of several GHz.

Integrated inductors are being integrated into ICs because modern fine-line CMOS processes are capable of operating at a frequency of several GHz. The processes and technology are readily available from multiple foundry sources to achieve this level of performance. Accordingly, many design engineers at "fabless" semiconductor companies, design integrated "on-chip" inductors into ICs that operate at high frequencies.

One of the drawbacks of prior art "on-chip" inductors is the low Q, or quality factor, of the integrated inductor. The low Q limits the performance of the integrated inductors. One reason for this low Q is the unwanted dissipation of energy in the semiconductor substrate as is discussed in Yue, et al. *A Physical Model for Planar Spiral Inductors on Silicon*, Int. Electron Devices Meet. Tech. Digest, December 1996, 196, pp. 155–158; which is incorporated herein by reference.

Various techniques for increasing Q have been tried, including the use of substrate material having a high resistivity, see Ashby, et al., *High-Q Inductors for Wireless Applications in a Complementary Silicon Bipolar Process*, IEEE Journal of Solid-State Circuits, vol. 31, pp. 4–9, January 1996; also incorporated herein by reference. Etching a pit or trench below the inductor was discussed in Chang, et al., Large, *Suspended Inductors on Silicon and Their Use in a 2-mm CMOS RF Amplifier*, IEEE Electron Device Letters, vol. 14, pp. 246–248, May 1993, and using a ground shield between the inductor and the substrate was discussed in Yue, et al., *On-Chip Spiral Inductors with Patterned Ground Shields for Si-Based RF IC's*, IEEE Journal of Solid-State Circuits, vol. 33, pp. 743–751, May 1998; Rofougaran et al., *A 1 GHz CMOS RF Front-End for a Direct Conversion Wireless Receiver*, IEEE Journal of Solid-State Circuits, vol. 31, pp. 880–889, July 1996; and Tsukahara et al., *A 2 GHz 60 dB Dynamic-Range Si Logarithmic/Limiting Amplifier with Low-Phase Deviations*, in Int. Solid-State Circuits Conf. Dig. Tech. Papers, February 1997, pp. 82–83; all of which are incorporated herein by reference.

Another technical reference which discusses some limitations of real-world integrated circuit inductors is *On-Chip RF Spiral Inductors and Bandpass Filters Using Active Magnetic Energy Recovery*, by Wu and Chang, was published in the Proc. IEEE Custom Integrated Circuits Conference, May 2002, pp. 275–278. This paper discusses an active circuit which may be used to enhance the Q of integrated circuit inductors. It does not address the issue of increasing the operating frequency of the inductor circuit.

U.S. Pat. No. 6,233,012 granted May 15, 2001, is entitled Parasitic Capacitance Reduction for Passive Charge Read-Out by Guerrieri et al. describes a integrated circuit with a driven shield underneath a sensitive lead that has some finite capacitance. This reference shows that the capacitance to the shield underneath can be made to effectively be eliminated by using a unity-gain amplifier to drive the shield. In this reference, the sensitive lead is at an equipotential, and so is the shield. So even though this sensitive lead may cover some significant physical area, a single shield, of one potential, is adequate to cancel the oxide capacitance of interest.

The article *On-Chip Spiral Inductors with Patterned Ground Shields for Si-Based RF IC's*, shows that a solid metal sheet below the inductor provides shielding from the substrate, but incurs losses due to induced eddy currents. This reference also shows that by cutting small slits in the otherwise continuous metal sheet below the inductor, the losses due to these eddy currents may be eliminated and the overall inductance and quality factor of the inductor may be improved. While this technique offers some improvements (a reported 33% improvement in the Q at 2 GHz), the bottom plate is in close proximity to the relatively large surface area of the inductor, and as such forms a parallel-plate capacitor with significant capacitance. This capacitance reduces the self-resonant frequency, and can limit the overall frequency performance. However, as mentioned at page 749 of the article, there are almost no substrate losses.

Therefore it is desired to have an integrated inductor that does not have significant substrate losses, and one which has a high self-resonant capacitance, thus allowing very high frequency performance.

SUMMARY OF THE INVENTION

An integrated circuit is disclosed that includes a semiconductor substrate having a major body portion with a conductive layer having a predefined boundary and located on a first surface of the major body portion. An insulating layer is located over the conductive layer, over which an integrated inductor is located. An amplifier is connected between the integrated inductor and the conductive layer.

The integrated inductor can be divided into joined segments of equal length or inductance with buffer amplifiers connected between the joints of the segments and the conductive layer.

BRIEF DESCRIPTION OF THE FIGURES

FIG. 2 A high frequency differential amplifier, including a first and second tank circuit;

FIG. 3a A graph representing the voltage distributed across the inductor of FIG. 1;

FIG. 3b A graph representing the potential difference between the equipotential shield and segments of the inductor;

FIG. 3c Calculations illustrating the improvement in capacitance cancellation from the shield of FIG. 1;

FIG. 6a A graph representing the voltage distributed across the inductors of FIG. 4;

FIG. 6b Calculations illustrating the improvement in capacitance cancellation from a two segment shield;

DETAILED DESCRIPTION OF THE EMBODIMENTS

The solution herein identifies a method and device for increasing the self-resonant frequency of an integrated inductor without increasing the substrate loss, and as such, results in further improvements the operating frequencies of the tank circuit.

Figure 1:
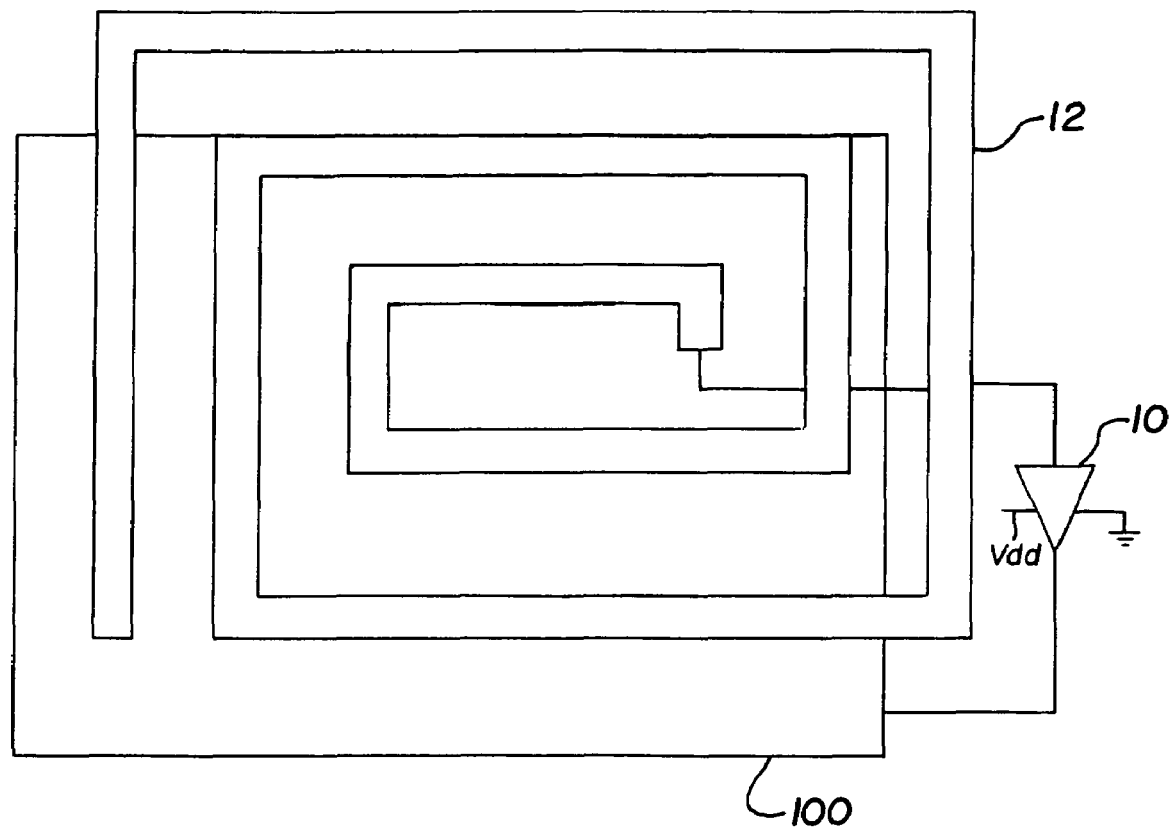
FIG. 1 An integrated inductor, with driven shield.

The basic idea is to utilize a buffer amplifier 10 of FIG. 1 to drive a conductive plate 100 beneath an inductor 12 with a signal that closely approximates the average signal across the inductor. If the ac voltages on both plates of a parallel-plate capacitor are the same, such as the capacitance created between the inductor 12 and plate 100, then this capacitance does not charge or discharge at signal frequencies, and its effective value in the circuit disappears. This technique may be used to reduce the capacitance seen by an integrated inductor.

The solution for improving both the operating frequency and the Q of the integrated inductors uses the buffer amplifier 10 to drive the shield 100 that is physically below the integrated inductor 12 with a voltage that minimizes the self-capacitance of the inductor 12 and shield 100. Because integrated circuit inductors can occupy a significant amount of physical area, an equipotential shield 100 is found to have different capacitance compensation at one end of the inductor than at the other end, as will be explained later.

As integrated inductors can occupy a significant amount of area, an equipotential shield 100 is found to have different capacitance compensation at one end of the inductor than at the other end. FIG. 2 illustrates a typical high-frequency differential amplifier circuit 200 that includes a first tank circuit T1 and a second tank circuit T2, acting as a load for the differential amplifier. Tank circuit T1 includes an inductor L1 and a capacitor C1, which is selected to tune the tank circuit T1 to its operating frequency having already considered any parasitic capacitance. Tank circuit T2 includes an inductor L2 and capacitor C2 similarly, selected to tune the tank circuit T2 to its operating frequency. Transistors MN1 and MN2 are the active gain elements, biased up to a desired current level by means of the tail current source I1. Vd1 and Vd2 are the single-ended ac voltages appearing at the drains of the transistors MN1 and MN2.

Prior art circuits had a shield underneath the inductor, but this shield was biased at a fixed potential, and created a significant capacitance with the integrated inductor. In order to improve the frequency performance of the circuit of this invention, the shield will be driven with an ac potential that effectively reduces at least some of the capacitance of the shield, as shown in FIG. 1. In this circuit with an equipotential shield, the driving voltage that provides the greatest capacitance compensation for the shield is an ac voltage at the electrical midpoint of the inductor L1 or L2 with the ac value of either Vd1/2 or Vd2/2. This potential may easily be selected at the appropriate point of the inductor, between the drain of transistors MN1 or MN2 and the supply rail, Vdd. Alternative ways to obtain the correct driving voltage include using ground instead of Vdd, as is well known by persons of skill in the art, by recognizing that either Vdd or ground is ac ground.

FIG. 1 shows a single shield segment driven by single potential, Vd1/2, with the potentials at either end of the inductor being respectively Vd1 and Vdd. Since we are only interested in small signal ac voltages, Vdd is known to be ac ground, or zero. The voltage difference between the shield and any point on the inductor is linearly related to the length of the inductor. By using piece-wise linear analysis, and eleven pieces of the inductor, FIG. 3b shows the potential difference between the one piece bottom shield and eleven portions along the length of the inductor. It is seen that the potential difference is zero for the center piece labeled 14. This potential difference is zero because the shield is driven by a signal equal to Vd1/2. For this center segment 14, since there is no ac voltage appearing across the capacitance associated with segment 14, there is no effect to this segment associated with this capacitive segment. FIG. 3b also shows that the farther away from center segment 14 one goes, the greater the potential difference grows in absolute magnitude.

The driving voltage that provides the greatest capacitance compensation for the shield is an ac voltage at the electrical mid-point, Vd1/2 or Vd2/2 between the drain of transistors MN1 or MN2 and the supply rail, Vdd. Alternative ways to obtain the correct driving voltage include using ground instead of Vdd, as is known by persons of skill in the art, by recognizing that either Vdd or ground is ac ground.

The correct voltage vs. electrical length using the single segment equivalent of the distributed system shown in FIGS. 3a and 3b. Referring to FIG. 3a, a line 101 illustrates the voltage that is distributed across the inductor 12 and the resulting capacitance. FIG. 3b represents the potential difference between the equipotential shield, and eleven segments of the inductor. FIG. 3b curve 103 illustrates the voltage being divided into eleven segments ranging from Vd1/2 to −Vd1/2. Using the eleven-lump equivalent of the inductor, and the shield that is driven by a single voltage, one sees that there is only one sub-segment 14 that is driven by the optimum voltage for capacitance cancellation. In addition there are an equal number, 5, of sub-segments that are driven with a voltage greater than the correct voltage and less than the correct voltage. In FIG. 3c calculations show that a single shield such as that of FIG. 1 can improve the capacitance cancellation by a weighted average of 73%. Thus, using this single-potential driving method, the overall cancellation of the capacitance is approximately 73%, which means that the overall capacitance between inductor 12 and the shield 100 is reduced 73%. This reduction in the capacitance that the inductor must drive can result in an improvement of its self-resonant frequency by 73%.

Figure 4:
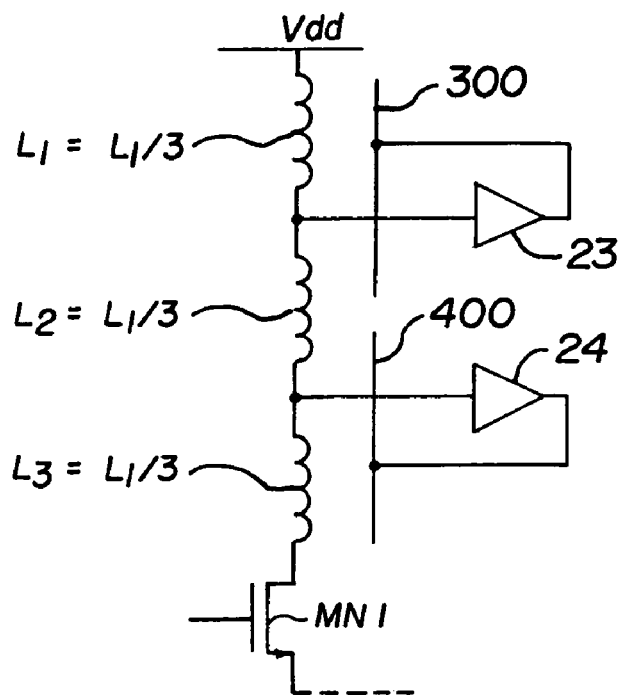
FIG. 4 A two lump shield with buffer amplifiers driving the segments.
Figure 5:
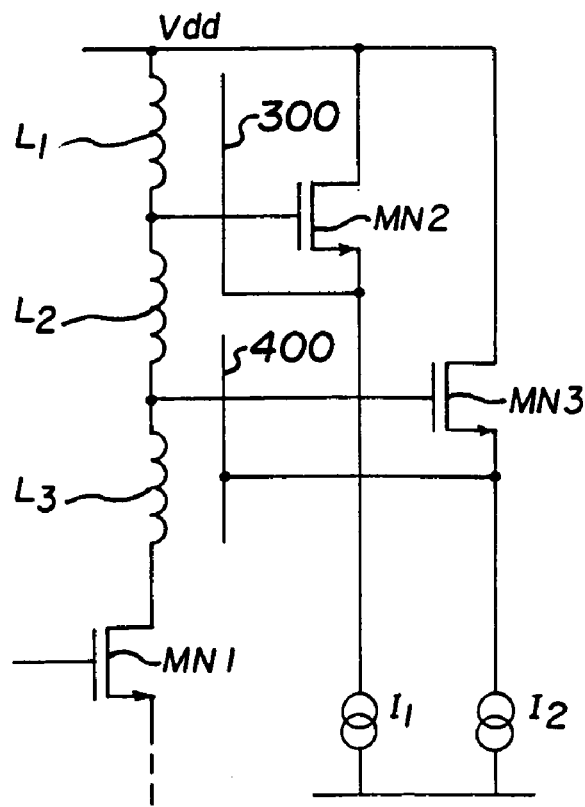
FIG. 5 A two lump shield with source followers driving the segments.

Increased compensation of the capacitance to the shield may be obtained by breaking the shield into more lumps than the single lump described above. For a two-lump solution, the shield is broken into two different portions, and both are driven with different potentials that minimize the overall capacitance between the inductor and the shield. An equivalent schematic is shown in FIGS. 4 and 5, where buffer amplifiers 23 and 24 with unity-gain amplification are shown connected to the inductors L1, L2 of the load of MOS transistor MN1. Persons of skill in the art will recognize that there are many ways to create these unity-gain buffers, not only including closed-loop amplifiers, but open-loop amplifiers, such as the source followers MN2, MN3 and current source I, as shown in FIG. 5.

FIGS. 4 and 5, show that the shield is broken into two portions (300 & 400), whereas the inductor is separated into three portions, L1,L2 and L3, in order to obtain the voltages to drive the inputs of the unity-gain amplifiers 23 and 24.

Dividing the shield 100 into more than one piece such as 300 and 400 is important for integrated inductors, because integrated inductors occupy significant area on the chip. For example, for a reasonable amount of inductance such as 5–10 nH, the inductor may be 300 microns or more in diameter. Thus, the integrated inductor does not act like a lumped component, but instead, has its inductance distributed over a relatively substantial area of a chip.

For a two-segment implementation, the correct driving voltages are shown in FIG. 6a as 113 and 115. This implementation is much like that shown in FIG. 3a, with the exception that there are two such segments of FIG. 6b, and the overall error between sub-segments is reduced when compared to the previous one-lump solution of FIGS. 1 and 3. Using the two-lump solution, the amount of capacitance compensation that is obtained is approximately 86%, which amounts to an 86% improvement in self-resonant frequency, and an 86% improvement in maximum operating frequency compared to the prior art solution where the shield is not driven.

Figure 7:
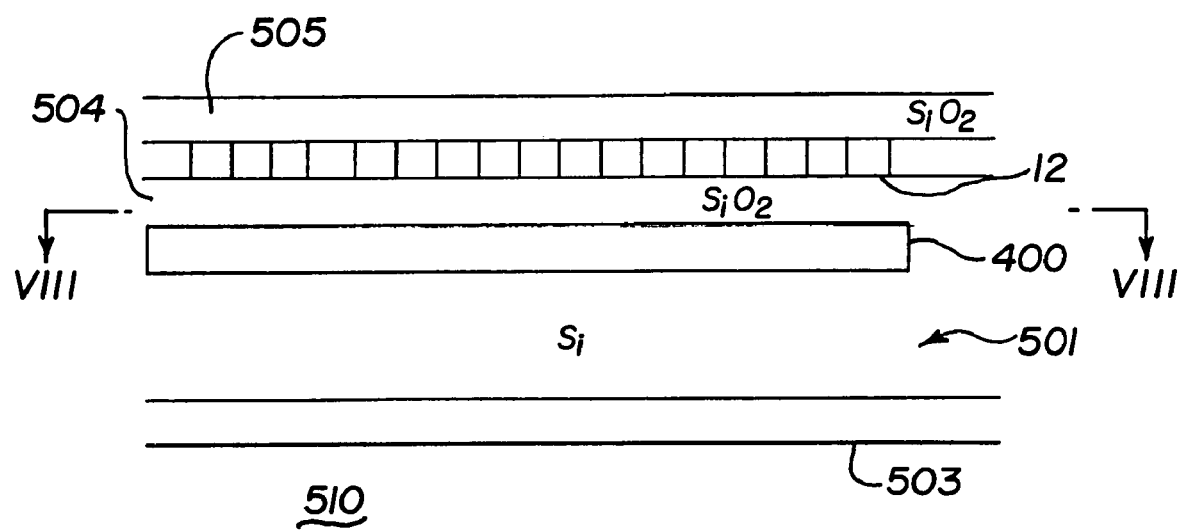
FIG. 7 A sectional view of the integrated circuit 500.

A sectional view of an Integrated Circuit 500 is shown in FIG. 7 to which reference should now be made. There is show a major body portion 501 of silicon over a substrate 503. A dual section shield 400 is located beneath the integrated inductor 12 and separated therefrom by an insulating layer 504 such as silicon dioxide. There is an additional insulating layer 505 covering the integrated inductor 12.

Figure 8:
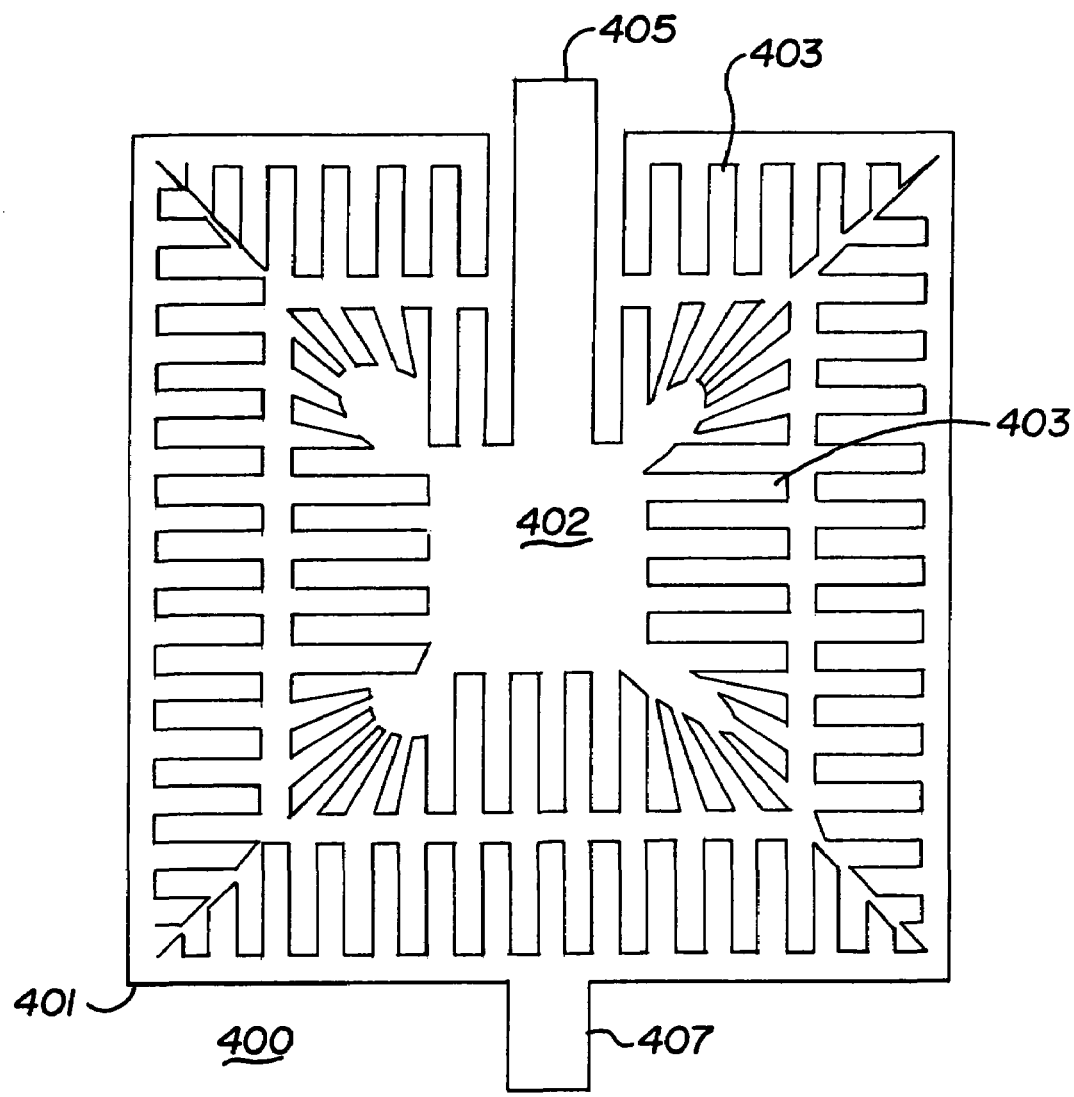
FIG. 8 A top view of the lower shield 400.

A top layout view of the lower shield 400 as seen from dimension arrows VIII—VIII is shown in FIG. 8. The lower shield 400 may be polycrystalline silicon, metal, or another similar conductive materials. The integrated inductor 12 may be polycrystalline silicon, metal, or otherwise suitable conductor, and might also be comprised of some combination of these. The lower shield 400 is divided into two segments an inner segment 402 and an outer segment 401. The inner segment 402 and the outer segment 401 are slotted by slots 403 to reduce unwanted eddy currents.

It is known that the quality factor of the inductors may be improved by utilizing multiple levels of conductor for the top conductor of the inductor in parallel, thus reducing the overall series resistance of the spiral (or approximate spiral).

Figure 9:
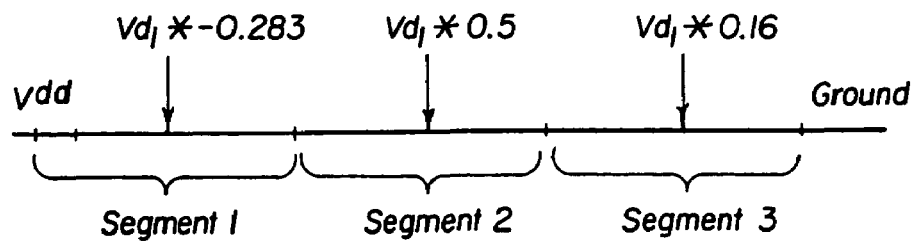
FIG. 9 A waveform representing a three lump shield for increasing integrated inductor performance.

Increased capacitance compensation may be obtained by breaking the shield into more than two segments as shown in FIG. 9. The capacitive compensation obtained by increasing the number of shield segments from two to three, goes from 86% to 91%. This relatively small increase may not be justified by the additional layout complexity involved in segmenting the shield.

Figure 10A:
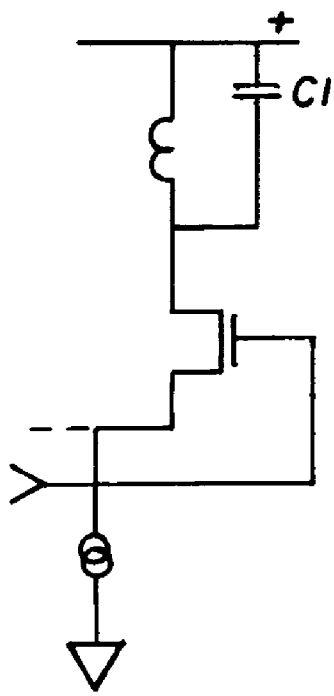
FIG. 10a A schematic of a differential half circuit representative of the schematic of FIG. 1.
Figure 10B:
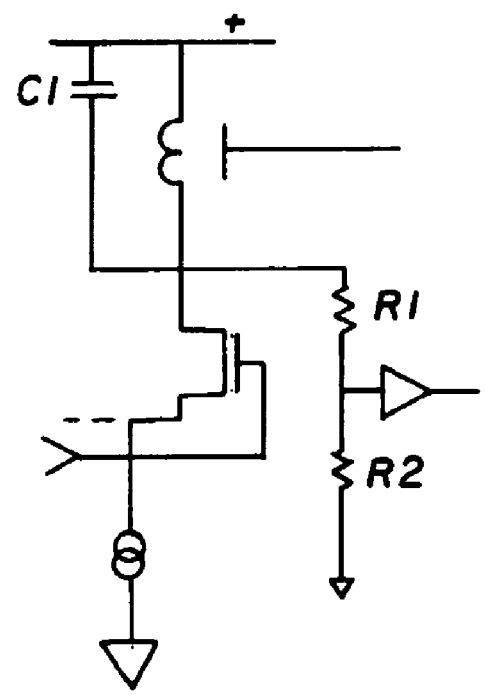
FIG. 10b An first alternative to the circuit of FIG. 10a wherein a resistive voltage divider is utilized.
Figure 10C:
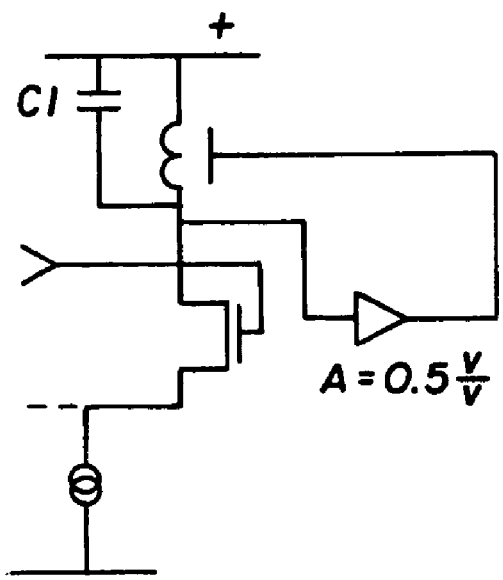
FIG. 10c A second alternative to the circuit of FIG. 10a wherein the output of the amplifier is used to drive the shield directly.
Figure 10D:
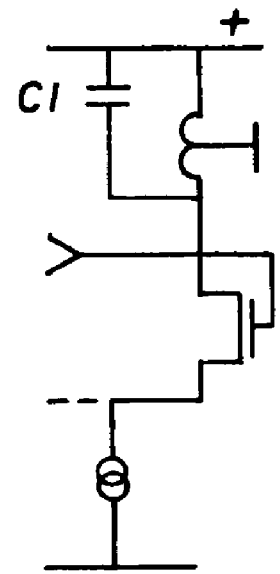
FIG. 10d A third alternative to the circuit of FIG. 10a wherein the inductor is tapped to drive the shield.

FIG. 10a is a differential half circuit, representative of the schematic shown in FIG. 1. FIG. 10b shows an alternative technique to create the appropriate driving voltage for driving a single segment shield. A resistive voltage divider with equal-valued resistors R1 and R2 is shown followed by a unity-gain amplifier. The ac driving voltage is Vd1/2, and is the same potential as previously described by tapping a voltage at the mid-point of the inductor. Because the quality factor of the inductor is dependent upon the resistance of the metal spiral, it may be desirable to utilize every available metal layer in the IC process to create the lowest resistance inductor possible. This approach would create metal spirals with one or more metal levels, each hooked electrically in parallel, thereby reducing the overall resistance of the inductor. Therefore, in order to obtain the lowest resistance, highest-Q inductor, all metal levels are used in creating the spirals, and hence there would not be a free level in order to reach into the inside of the inductor, and bring the tapped voltage out. The resistive divider of FIG. 10b can create the right driving potential without having to actually tap the inductor itself, leaving all metal layers available to minimize the resistance. FIG. 10c shows a different driving scheme, whereby the gain of the buffer amplifier A1 is 0.5 V/V. The output of this amplifier can then drive the shield signal directly. In another embodiment, a gain of 0.5 may be obtained by using a unity gain amplifier, which is followed by an affenuator, which in turn can drive the shield. Finally, in FIG. 10d, another scheme is shown whereby the inductor is tapped and it drives the shield directly. While not shown, the driving voltage may be created by some combination of resistive divider and gain of the amplifier. For example, if a source follower amplifier is used, with a gain of 0.9V/V, then a resistive divider with attenuation of 0.555 might be used in order to deliver a driving voltage of Vd1/2 for the single shield shown in FIGS. 1 or 10.

While for simplicity, the above alternative drive circuits were shown to have only one lump of shield, it is understood that multiple lumps are possible with these driving methods.

The above idea teaches that the capacitance of the inductor may be affected by the ac driving voltage from a resistive divider. This idea may be extended to allow the LC tank circuit as it is used in the application to be tuned to the desired frequency of interest. There are many circumstances where an LC tank circuit is intended to be operated where the signal frequencies are pre-defined, perhaps due to system requirements. In this situation, the center frequency of the tank may need to be at the center of the frequency band of interest. This circumstance most often requires the adjustment of capacitance associated with the inductor in order to tune the tank circuit to the center frequency of interest. This requirement is true even for tank circuits in integrated circuits, where the absolute control of capacitance or inductance as fabricated is not precise enough for many applications. So in this case, extra capacitors are integrated onto the chip, and then either through an algorithm implemented in logic, or through a one-time trimming event, the desired amount of capacitance is added in small increments to the inductor to adjust the center frequency to the desired point. Instead of using separate discrete capacitors, the voltage may be varied upon the shield in order to tune the center frequency of the tank to the desired frequency. This may be accomplished by using either volatile or non-volatile adjustment circuits. Non-volatile adjustments are well known for integrated circuits, and include zener zap, laser trimming, EPROM and others. Volatile adjustment circuits are also well know, and include logic circuits in conjunction with a DAC in order to create the desired ac driving voltage using either resistive dividers, MDACs, voltage-controlled amplifiers, or other known circuits.

It is clear from the previous examples that desirable improvements in operating frequency may be obtained with less than perfect cancellation voltages on the various shield portions, and less than perfect alignment of the shield to the inductor. It should also be clear that some cancellation of the capacitance associated with the integrated inductor is possible if an appropriate ac voltage is applied to any portion of a shield, regardless of how this voltage is created, either with or without an amplifier of any type.

We claim:

1. An integrated circuit, comprising:
   a semiconductor substrate having a major body portion;
   a conductive layer having a predefined boundary and located on a first surface of the major body portion, said conductive layer formed with individual fingers;
   an insulating layer positioned over the conductive layer;
   an integrated inductor located on the insulating layer over the conductive layer;
   said inductor having a current path that crosses the width dimension of said fingers; and
   an amplifier connected between the integrated inductor and the conductive layer.

2. The integrated circuit according to claim 1 wherein the integrated inductor has a predefined length with a center position and an input to that amplifier is connected to the center position.

3. The integrated circuit according to claim 1 wherein the integrated inductor has a predefined inductance with a center position dividing the inductance and an input to that amplifier is connected to the center position.

4. The integrated circuit according to claim 1 further comprising a second amplifier and wherein the integrated inductor has a predefined length comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection.

5. The integrated circuit according to claim 4 wherein the first, second and third portions all are of equal length.

6. The integrated circuit according to claim 1 further comprising a second amplifier and wherein the integrated inductor has a predefined inductance comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection.

7. The integrated circuit according to claim 6 wherein the first, second and third portions are all of qual inductance.

8. The integrated circuit of claim 1 wherein the amplifier has a voltage gain of one or less.

9. An integrated circuit comprising:
   a semiconductor substrate having a major body portion;
   a conductive layer having a predefined boundary and fingers and located on a first surface of the major body portion;
   an insulating layer positioned over the conductive layer;
   an integrated inductor located on the insulating layer over the conductive layer;
   wherein at least some portion of a current path of said inductor being approximately perpendicular to the length dimension of said fingers; and
   wherein at least one portion of said conductive layer is biased to an ac potential, which is representative of the ac voltage at some point on said inductor.

10. The integrated circuit according to claim 9 and including a first amplifier wherein the integrated inductor has a predefined length with a center position and an input to said amplifier that is connected to the center position.

11. The integrated circuit according to claim 9 and including an amplifier wherein the integrated inductor has a predefined inductance with a center position dividing the inductance and an input to an amplifier that is connected to the center position.

12. The integrated circuit according to claim 9 further comprising a first and second amplifier and wherein the integrated inductor has a predefined length comprising a first portion, a second portion and a third portion with the second portion being electrically connected to the first portion at a first connection and the input to the first amplifier being connected to the first connection and the third portion being electrically connected to the second portion at a second connection and an input to the second amplifier being connected to the second connection.

13. The integrated circuit according to claim 12 wherein the first, second and third portions all are of equal length.

14. The integrated circuit according to claim 9 further comprising a first and second amplifier and wherein the integrated inductor has a predefined inductance comprising a first portion, a second portion and a third portion with the second portion being electrically connected to the first portion at a first connection and the input to the first amplifier being connected to the first connection and the third portion being electrically connected to the second portion at a second connection and an input to the second amplifier being connected to the second connection.

15. The integrated circuit according to claim 14 wherein the first, second and third portions are all of equal inductance.

16. The integrated circuit of claim 9 further comprising an amplifier having a voltage gain of 0 dB or less.

17. A method for increasing the self-resonant frequency of an integrated inductor by:
   forming a conductive layer beneath the inductor;
   said conductive layer having a plurality of individual segments thereof, said plurality of segments underlying said inductor;
   forming an insulating layer between the conductive layer and the inductor; and
   connecting an amplifier between the integrated inductor and the conductive layer;
   wherein the integrated inductor has a predefined length with a center position and an input to that amplifier is connected to the center position.

18. The method according to claim 17 wherein the integrated inductor has a predetermined inductance with a center position dividing the inductance and an input to that amplifier is connected to the center position.

19. The method according to claim 17 further comprising a second amplifier and wherein the integrated inductor has a predefined length comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection, wherein the first, second and third portions all are of equal length.

20. The method according to claim 17 further comprising a second amplifier and wherein the integrated inductor has a predefined inductance comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection, wherein the first, second and third portions are all of equal inductance.

21. A circuit that includes an integrated inductor with its self-resonant frequency increased by:
forming a conductive layer beneath the inductor; said conductive layer being comprised of a number of individual fingers;
forming an insulating layer between the conductive layer and the inductor;
connecting an amplifier between the integrated inductor and the conductive layer.

22. A circuit according to claim 21 wherein the integrated inductor has a predefined length with a center position and an input to that amplifier is connected to the center position.

23. A circuit according to claim 21 wherein the integrated inductor has a predefined inductance with a center position dividing the inductance and an input to that amplifier is connected to the center position.

24. A circuit according to claim 21 further comprising a second amplifier and wherein the integrated inductor has a predefined length comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection.

25. The integrated circuit according to claim 24 wherein the first, second and third portions all are of equal length.

26. The integrated circuit according to claim 21 further comprising a second amplifier and wherein the integrated inductor has a predefined inductance comprising a first portion, a second portion and a third portion with the second portion being electrically connected to the first portion at a first connection and the input to the amplifier being connected to the first connection and the third portion being electrically connected to the second portion at a second connection and an input to the second amplifier being connected to the second connection.

27. The integrated circuit according to claim 26 wherein the first, second and third portions are all of equal inductance.

28. The integrated circuit of claim 21 wherein the amplifier has a voltage gain of 0 dB or less.

* * * * *